United States Patent [19]

Balogh

[11] Patent Number: 5,197,041
[45] Date of Patent: Mar. 23, 1993

[54] PIEZOELECTRIC MUD PULSER FOR MEASUREMENT-WHILE-DRILLING APPLICATIONS

[76] Inventor: William T. Balogh, 6119 Windbrooke, San Antonio, Tex. 78249

[21] Appl. No.: 645,027

[22] Filed: Jan. 23, 1991

[51] Int. Cl.$^5$ ............................................. H04R 17/00
[52] U.S. Cl. ..................................... 367/160; 367/83; 181/106; 166/250; 310/330
[58] Field of Search .................... 367/160, 161, 83; 181/106; 340/853; 166/250; 310/330, 331, 332

[56] References Cited

U.S. PATENT DOCUMENTS

| | | | |
|---|---|---|---|
| 3,093,760 | 6/1963 | Tarasevich | 310/330 |
| 3,302,457 | 2/1967 | Mayes | 367/83 |
| 4,782,910 | 11/1988 | Sims | 367/160 |
| 4,939,405 | 7/1990 | Okuyama et al. | 310/330 |

*Primary Examiner*—J. Woodrow Eldred
*Attorney, Agent, or Firm*—Pravel, Gambrell, Hewitt, Kimball & Krieger

[57] ABSTRACT

A mud pulser for measurement-while-drilling applications is disclosed which employs piezoelectric transducers to provide for variations in the mud flow through a mud pulser sleeve. The piezoelectric transducers used in the mud pulser are comprised of two piezoelectric elements bonded together in a bender bar transducer configuration, thin metallic sheets to improve the rigidity of the transducer and to protect the ceramic material and electrodes from the effects of abrasive drilling fluid, and simplified mounting means.

7 Claims, 3 Drawing Sheets

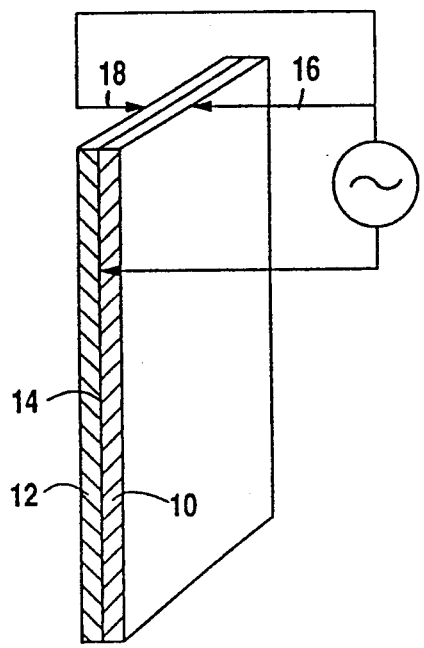
Fig. 1
PRIOR ART
 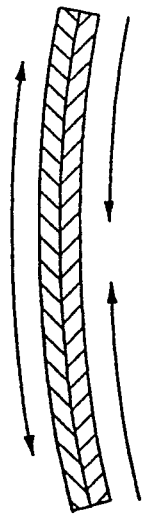 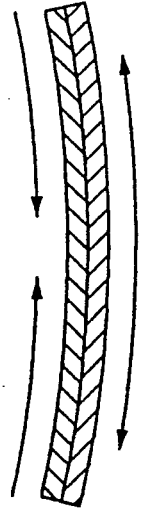
Fig. 2A
PRIOR ART
Fig. 2B
PRIOR ART
Fig. 2C
PRIOR ART

PIEZOELECTRIC MUD PULSER FOR MEASUREMENT-WHILE-DRILLING APPLICATIONS

FIELD OF THE INVENTION

The present invention relates generally to the field of measurement-while-drilling (MWD) applications. More specifically, the present invention relates to the telemetry of data in MWD applications using piezoelectric transducers.

BACKGROUND

Mud Pulsers

It is well known that the efficiency of oil well drilling operations can be significantly enhanced by monitoring various drilling parameters at the drill bit. For example, information about the location and orientation of the downhole drilling assembly is necessary for accurate control during directional drilling operations. Furthermore, downhole drilling parameters, such as torque and weight-on-bit, can be combined with new drill bit technologies to enhance penetration rates and to significantly reduce drilling costs.

In the late 1960's and early 1970's, various measurement-while-drilling (MWD) systems were developed to allow the measurement of downhole drilling parameters and the telemetry of these data to the surface. In the late 1970's, commercial MWD services were offered by several oil field service companies. Presently, all commercial MWD systems are similar in that the hydraulic fluid coupling between the drill bit and the mud pump at the surface is used as the data telemetry channel.

Conventional MWD technology involves the downhole measurement and encoding of drilling parameters and the modulation of a drilling fluid, normally referred to as the drilling mud, via a mud flow valve, normally referred to as a mud pulser, which is located near the drill bit. The mud pulser operates in either a negative mud pulse configuration or in a positive mud pulse configuration. In a negative mud pulse configuration, drilling mud is vented from the inside of the drill pipe to the annulus. In a positive mud pulses configuration, mud flow in the drill pipe is restricted. In either case, the positive and negative pressure fluctuations generated by the mud pulser propagate up the inside of the drill pipe, to the surface, where they are detected and decoded.

All commercial mud pulser devices are mechanically complicated, requiring a significant amount of energy to actuate the valve, involving complex pressure compensation schemes, and utilizing intricately shaped valve assemblies which are exposed to abrasive muds. As a result of this complexity, pulser assemblies exhibit a mean time between failure rates of approximately 200 hours and usually require total rebuilding after field service. Because of the significant energy requirements of the pulsers, the MWD systems are further complicated by complex high power electronic designs and turbine/generator assemblies. This complexity of conventional MWD systems results in reduced reliability and cost effectiveness of the MWD systems as a whole.

Piezoelectric Transducers

Piezoelectric materials, when used as source transducers, can be characterized as providing small mechanical motions, on the order of micro-inches per inch, when excited by an electrical signal. However, transducer configurations do exist which amplify these mechanical motions. One such configuration is the bender bar configuration, as shown in FIG. 1, which is composed of two piezoelectric bars 10 and 12 rigidly bonded together by adhesive bond 14 in a bender bimorph structure. Each piezoelectric ceramic bar has electrodes 16 and 18 on the large flat opposing surfaces. The piezoelectric bar is polarized such that a voltage excitation applied to the electrodes produces either a lengthwise expansion or contraction of the piezoelectric bar depending on the polarity of excitation.

The mechanical action of the bender bar is shown in FIGS. 2A–C. When no excitation signal is applied to the electrodes, as in FIG. 2A, the bender bar is flat. It should be noted that in this example, the piezoelectric material is polarized so that a positive excitation results in a lengthwise expansion of the piezoelectric material on the left side of the composite structure and a corresponding contraction of the piezoelectric material on the right side of the composite structure. This lengthwise expansion and contraction results in a bowing or bending of the center portion of the composite structure to the left, as shown in FIG. 2B. Likewise, a negative excitation signal results in a bowing at the center in the opposite direction, as shown in FIG. 2C. The significance of the bender bar is that the configuration forms a mechanical amplifier. Relatively small lengthwise expansions and contractions of the piezoelectric material result in significant motions at the central portion of the bender. This motion concept can be extrapolated so that by doubling the length of the bender the motion at the center of very long bender bars can become most significant. However, to achieve this increase in motion the mechanical impedance of the composite structure does change, resulting in a reduction in the force that the structure can exert at its central portion and a reduction in the resonant frequency of the structure.

SUMMARY OF THE INVENTION

The present invention provides for a piezoelectric mud pulser designed to be used for generating hydraulic pressure fluctuation is drilling mud for telemetry of data in MWD applications. The mud pulser is comprised of a pulser sleeve, upper and lower end units which divert fluid flow through the center of the pulser, bender bar transducers located around the interior periphery of the pulser sleeve, and an oil or Urethane ™ filler which fills any void between the bender bar transducers and the pulser sleeve. For low flow rate applications, the present invention provides for a central core which increases the amplitude of the MWD signals. The mud pulser device of the present invention is unique in that it is a mechanically simple design capable of providing greater reliability and reduced operating power requirements in comparison to conventional mud pulser devices. The pulser may be operated with batteries, and no high energy turbine/generator power source is required.

The present invention also provides for a bender bar transducer which may be mounted easily and is packaged to allow exposure to abrasive and/or conductive fluids. The bender bar transducer is comprised of two piezoelectric elements bonded together in a bender bar configuration, two end units which provide for simple mounting, and two metallic sheets bonded to the outer surfaces of the bender bar configuration to protect the piezoelectric elements and the electrodes from the effects of corrosive drilling fluid. The transducer electrode is encapsulated between the piezoelectric elements both for safety reasons and to protect the electrode from the effects of corrosive materials. While the transducer was designed specifically for use in the piezoelectric mud pulser, it may be used in a variety of source transducer applications.

BRIEF DESCRIPTION OF THE DRAWINGS

FIG. 1 is a schematic representation of a bender bar piezoelectric configuration known to the prior art.

FIGS. 2A-C are schematic representations of the mechanical action of the bender bar transducer of FIG. 1.

DETAILED DESCRIPTION OF THE PREFERRED EMBODIMENT

Figure 3A:
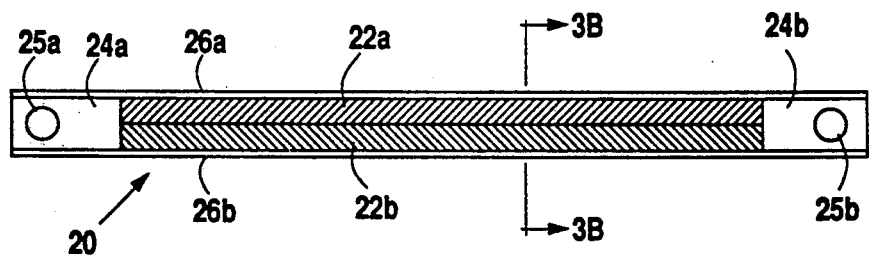
FIG. 3A is a schematic representation of a bender bar transducer used in a mud pulser according to one embodiment of the present invention.
Figure 3B:
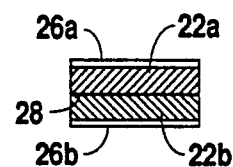
FIG. 3B is a cross-sectional view taken along the line A—A' of the bender bar transducer of FIG. 3A.

Referring now to FIG. 3, a bender bar transducer 20 according to one embodiment of the present invention is shown. The transducer 20 includes piezoelectric ceramic elements 22a and 22b bonded together, as well as well as insulating end supports 24a and 24b. The insulating end supports 24a and 24b simplify the mounting of the transducer 20, and are each provided with an aperture 25a and 25b. The transducer 20 also includes plates 26a and 26b which are bonded to the outer flat surfaces of the piezoelectric elements 22a and 22b and to the insulating end supports 24a and 24b. The plates 26a and 26b may be thin, metallic plates or plates of any suitable material and thickness, and serve to improve the rigidity of the end supports and protects the electrodes and the ceramic material from the effects of abrasive fluids. The thickness of the plates 26a and 26b is preferably designed to avoid significant interference with the performance of the transducer. Referring now to FIG. 3B, the transducer also includes high voltage electrodes 28 which are encapsulated between the plates 26a and 26b both for safety reasons and to allow exposure of the transducer to conductive fluids.

Figure 4:
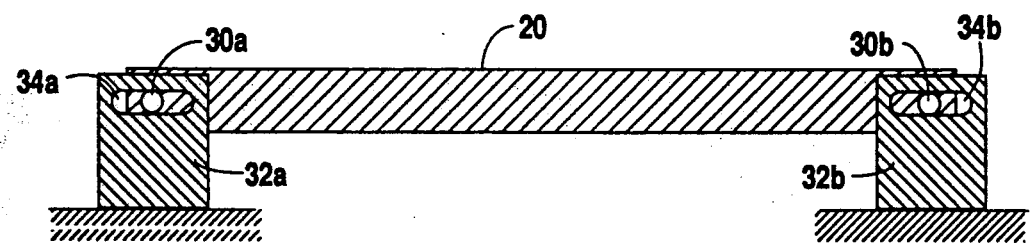
FIG. 4 is a schematic representation of the mounting of the bender bar transducer of FIG. 3.

Referring now to FIG. 4, the mechanical mounting of the bender bar transducer 20 is shown. Each end of the bender bar 20 is supported by mounting rods 30a and 30b and mounting blocks 32a and 32b. The mounting rods 30a and 30b are inserted through the insulating end supports 24a and 24b, respectively, and extend into slots 34a and 34b on the mounting blocks 32a and 32b, respectively. The slots 34a and 34b on mounting blocks 32a and 32b serve to provide two degrees of freedom for the mounting rods 30a and 30b, rotational and horizontal. With this mounting configuration, the vertical positions of the ends of the transducer 20 are fixed while the central portion of the bender moves as depicted in FIG. 4.

Various performance characteristics of the bender bar have been mathematically defined and experimentally verified; see *Piezoelectric Ceramics*, J. van Randeraat and R. E. Setterington, Mullard House, London, 1974, pp. 41-53, also *Handbook of Physical Calculations*, Jan J. Tuma, McGraw Hill, N.Y., 1983, pp. 110-189. The deflection of the bender bar transducer 20 at its center, Z, is:

$$Z = K_f F[l^3/wt^3] + K_v V[l^2/t^2]$$

where:
Z = bender bar center deflection;
$K_f$ = force deflection factor;
F = force applied to the center of the bar;
l = bender bar length;
w = bender bar width;
t = bender bar thickness;
$K_v$ = voltage deflection factor; and
V = voltage applied to the bender.

The resonant frequency of the bender bar is:

$$f_r = K_f[t/l^2]$$

where:
$f_r$ = bender bar resonant frequency;
$K_f$ = resonant frequency factor;
l = bender length; and
t = bender thickness.

The capacitance of the bender bar is $C = K_c[lw/t]$, where $K_c$ = capacitance factor.

For the bimorph bender geometry and construction as shown in FIG. 1, the coefficients have been defined for the static case as follows: $K_v = -2.15 \times 10^{-9}$ in/V, $K_f = 31$ $1.55 \times 10^{-8}$ in$^2$/lbf; $K_f = 3.30 \times 10^4$ Hz-in., and $K_c = 1.02$ nF/in.

Using these mathematical relationships, a bender bar with a length of approximately 40 inches would have a resonant frequency of 10 Hz and a capacitance of 81.5 pF. The maximum rated operating voltage for the bender bar is 4000 Volts DC. With ±4000 volts applied, the deflection at the center of the bar is ±0.055 inches or a total deflection of 0.11 inches. A 1 lb. force applied to the center of the bender bar would produce a deflection of 13.7 mils. Although the deflection and force capabilities of the bender are not large, these results are based upon static measurements. The MWD pulser of the present invention will operate at the mechanical resonance of the bender bar transducers 20; therefore, the predictions based upon static measurements are highly pessimistic.

The design of the bender bar transducer 20 is self-contained, thus the active portions of the bar are protected from the effects of abrasive muds and conductive fluids. Also, personnel using the transducer are not exposed to potentially dangerous voltages. Further, encapsulation of the transducer 20 in a protective or non-conductive material is not required. The design of the bender bar transducer 20 also provides for an integral insulated mounting, thus, the mounting of the transducer is simplified. Also, the characteristics of the mounting are repeatable allowing repeatable transducer characteristics. Further, the reliability of the transducer is enhance because the mounting, being an integral component, does not subject the piezoelectric ceramic to unreasonable clamping forces.

Figure 5:
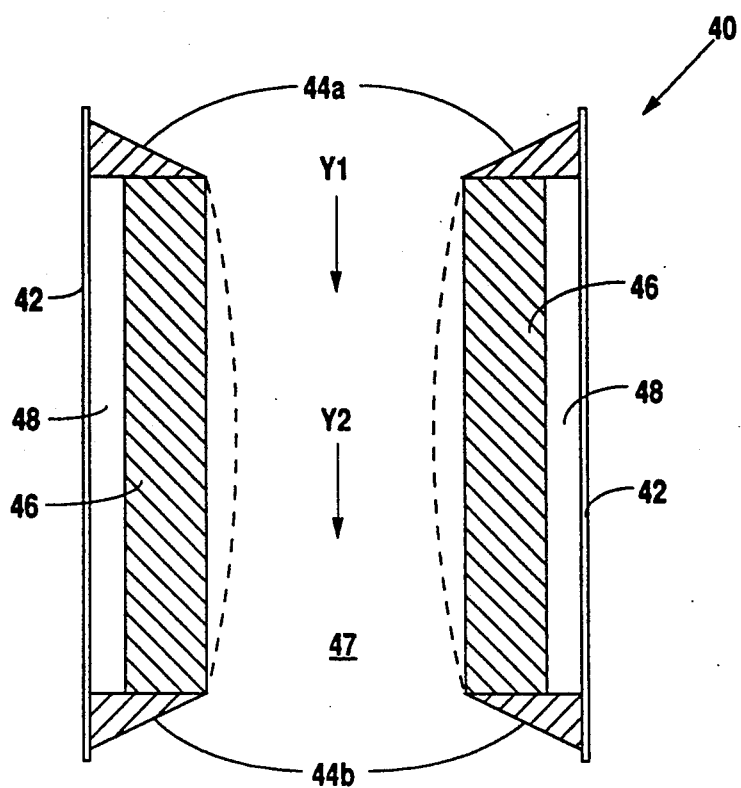
FIG. 5 is a schematic diagram of a vertical cross section of the piezoelectric mud pulser according to one embodiment of the present invention.
Figure 6:
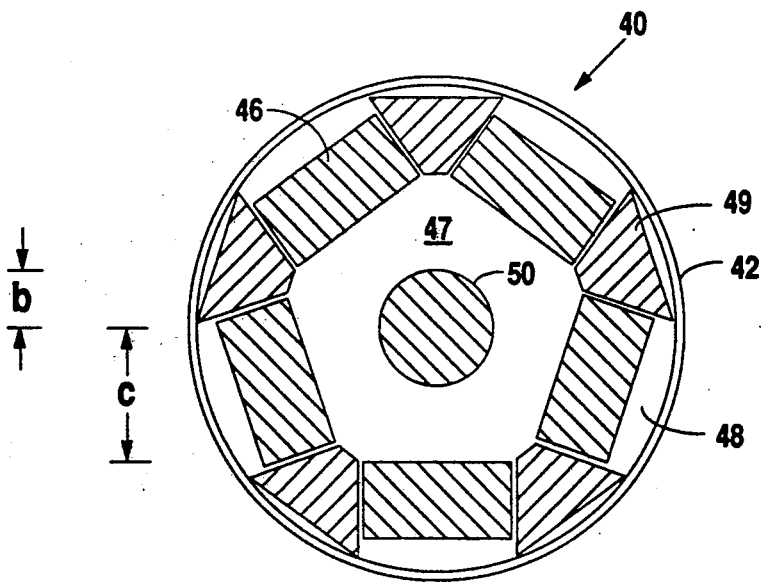
FIG. 6 is a schematic representation of a horizontal cross section of the piezoelectric mud pulser of FIG. 5.

Referring now to FIGS. 5 and 6, vertical and horizontal cross-sections of possible configurations of the bender bar pulser according to one embodiment of the present invention are shown. The pulser assembly 40 includes an outer pulser sleeve 42 which slides into a drill collar sub assembly (not shown), as well as upper and lower end elements 44a and 44b which divert the mud flow through the center of the pulser. In addition, the pulser 40 includes bender bar transducers 46 spaced circumferentially around the mud flow region 47 and a flexible Urethane ™ element or oil 48 which fills the void region between the bender transducers and the pulser sleeve. The bender bar transducers 46 may be transducers of the type described above, or any suitable bender bar transducer known to those of skill in the art. There is also provided a plurality of metallic bender spacers 49 which provide for the mounting of the bender bar transducers 46. For low flow rate applications, the pulser 40 includes a central core 50, shown only in FIG. 6, which is used to increase the MWD signal amplitude. FIGS. 5 and 6 depict a five bender element pulser configuration compatible with a 3½ inch inside diameter (ID) pulser sub-assembly and compatible with 4¾ inch outside diameter (OD) drill collars having and ID of 3.0 inches. It will be appreciated by those of skill in the art that the number of bender elements may be changed, as can the compatibility of the pulser.

As shown in FIG. 5, drilling mud flows in the central region of the pulser 40. The exaggerated motion at the center of the bender bar shows the manner in which mud flow is restricted during the application of an excitation voltage. For the purpose of later discussion, a valve closed condition exists when the mud flow is restricted in this manner. If an excitation voltage of the opposite polarity is applied, the bender will flex in the opposite direction reducing the pressure drop across the pulser and resulting in a valve open condition.

Referring again to FIG. 5, the hydraulic performance of the 3½ inch piezoelectric mud pulser may be estimated by determining the pressure drop per unit length, $\Delta p/L$, at the end of the pulser 40, position $Y_1$, and at the location of maximum bender deflection, position $Y_2$. The total pulser pressure drop for a valve open and closed condition may be determined by computing the mean value of the $\Delta p/L$ calculated for positions $Y_1$ and $Y_2$ and applying this mean value over the entire active pulser length. The pressure drop per unit length, $\Delta p/L$, is defined as:

$$\Delta p/L = (f/D)(\partial U^2/2)$$

where:
$\Delta p$ = pressure drop;
L = flow path length;
f = friction factor;
D = hydraulic diameter;
$\partial$ = density of water; and
U = flow velocity.

If the Reynolds number, Re, is assumed greater than $10^5$, implying turbulent flow, and all surfaces are assumed hydraulically smooth, the friction factor, f, may be calculated as $$f = 0.308/(0.842 - \log_{10} Re)^2$$

The pulser hydraulic area, A, and the hydraulic diameter, D, are defined as $$A = n c^2 \tan(36°) - \pi b^2 \text{ and } D = 4A/(2n c \tan(36°) + 4\pi b)$$

where:
A = hydraulic area;
n = number of sides;
c = the perpendicular distance;
b = the central core radius; and
D = hydraulic diameter.

Referring now to FIG. 6, the definition of certain variables such as the radius of the central core, b, and the perpendicular distance, c, from the bender bar to the radial center of the pulser 40 will be made clearer. Referring again to FIG. 5, at position $Y_1$, for either a valve open or closed position, the perpendicular distance c is fixed at 0.879 inches; thus, the hydraulic area and diameter at this position are also fixed. At position $Y_2$, the perpendicular distance c is 0.829 inches for a valve closed condition and 0.929 for a valve open condition.

The hydraulic performance of the piezoelectric pulser may be determined with water and with a central core radii of 0.400 and 0.629 inches. The 0.629 inch central core radius is significant in that it yields a minimum clearance distance around the core of 0.250 inches and avoids possible plugging of the pulser.

The results are presented in Tables 1 and 2 in the appendix. To verify the assumptions made relative to the flow conditions, the pressure drop across a 1000 feet of 3.0 inch ID pipe was calculated using an equation of the same form. These drill pipe pressure drop results are also presented in the tables and are in agreement with calculations obtained using a Reed Tool Company hydraulic slide rule.

For most MWD applications, the signal required for suitable data communication is highly dependent on the well hydraulic conditions. However, in general, signal amplitudes on the order of 1000 psi will yield satisfactory results and MWD signals are detectable if as low as 20 psi. Although the hydraulic results may appear somewhat inadequate both from the standpoint of the MWD signal amplitude and the high flow velocities required, those of skill in the art will appreciate that these results are pessimistic. All calculations were based upon static bender bar deflection measurements; however, the piezoelectric pulser will be operated at both mechanical and electrical resonance.

The pulser 40 of the present invention is advantageous in that it requires less power than conventional pulsers of the prior art. The bender bar transducer 20 used in the piezoelectric pulser 40 can be electrically modeled as a large capacitance, approximately 0.1 $\mu F$, in series with a small resistance, approximately 100 $\Omega$; therefore, the transducer 20 is ideally suited to excitation in a resonant configuration. Assuming a five transducer element pulser design, the pulser has a capacitance C of 0.5 $\mu F$ requiring a series inductance L of approximately 500 H for an electrical resonant frequency of 10 Hz. Assuming a signaling bandwidth of approximately 1 Hz, the Q of the resonant circuit is 10 with a series resistance R of $$R = (1/Q)(L/C)^{\frac{1}{2}}$$

Thus, the series resistance required for a signaling bandwidth of 1 Hz is 3162 $\Omega$. With a Q of 10, the required input signal for ±4000 volts peak at the transducer is ±400 volts peak or 282 volts RMS. The total resistive losses in the resonant circuit, including transducer losses, is 3162 $\Omega$; therefore, the power dissipated is 25.1 Watts. This loss is approximately one order of magnitude less than conventional MWD devices.

The reduced power requirement of the piezoelectric bender bar pulser 40 will enable battery operation of the complete downhole MWD system, thus eliminating the need for complex downhole turbine generator assemblies. This further simplification of the MWD system will not only provide a significant increase in the mean time between failure rates, but will also greatly reduce service company operating and maintenance costs.

The design of the mud pulser of the present invention is thus mechanically simpler than conventional designs, in that there are relatively few moving parts and their motion is simple in nature. Also, the entire pulser operates at fluid pressure, thus requiring no pressure compensation schemes. Further, mud flow is not highly concentrated and pressure losses are distributed across large areas of the bender bar surface thus reducing wear.

While the method and apparatus of the present invention have been described in connection with the preferred embodiment, it is not intended to limit the invention to the specific form set forth herein, but on the contrary, it is intended to cover such alternatives, modifications, and equivalents as may be included within the spirit and scope of the invention as defined by the appended claims.

TABLE 1

ESTIMATED HYDRAULIC PERFORMANCE OF THE PIEZOELECTRIC PULSER WITH A CENTRAL CORE OF 0.400 INCHES

| FLOW RATE (GPM) | PIPE PRESSURE DROP (psi/kft) | MAXIMUM FLOW VELOCITY (FPS) | OPEN PRESSURE DROP (psi) | CLOSED PRESSURE DROP (psi) | MWD SIGNAL AMPLITUDE (psi) |
|---|---|---|---|---|---|
| 800 | 414.6 | 128.8 | 42.4 | 62.2 | 19.8 |
| 850 | 463.3 | 136.9 | 47.4 | 69.5 | 22.1 |
| 900 | 514.4 | 144.9 | 52.6 | 77.1 | 24.5 |
| 950 | 568.0 | 153.0 | 58.1 | 85.2 | 27.1 |
| 1000 | 624.0 | 161.1 | 63.8 | 93.6 | 29.8 |
| 1050 | 682.4 | 169.1 | 69.8 | 102.3 | 32.5 |
| 1100 | 743.2 | 177.2 | 76.0 | 111.4 | 35.4 |
| 1150 | 806.4 | 185.2 | 82.4 | 120.9 | 38.5 |
| 1200 | 872.0 | 193.3 | 89.1 | 130.7 | 41.6 |
| 1250 | 939.8 | 201.3 | 96.0 | 140.8 | 44.8 |
| 1300 | 1010.1 | 209.4 | 103.2 | 151.3 | 48.2 |
| 1350 | 1082.6 | 217.4 | 110.6 | 162.2 | 51.6 |
| 1400 | 1157.4 | 225.5 | 118.2 | 173.4 | 55.2 |

TABLE 2

ESTIMATED HYDRAULIC PERFORMANCE OF THE PIEZOELECTRIC PULSER WITH A CENTRAL CORE OF 0.629 INCHES

| FLOW RATE (GPM) | PIPE PRESSURE DROP (psi/kft) | MAXIMUM FLOW VELOCITY (FPS) | OPEN PRESSURE DROP (psi) | CLOSED PRESSURE DROP (psi) | MWD SIGNAL AMPLITUDE (psi) |
|---|---|---|---|---|---|
| 200 | 33.3 | 51.3 | 13.4 | 24.4 | 11.0 |
| 250 | 49.8 | 64.1 | 20.0 | 36.4 | 16.5 |
| 300 | 69.3 | 76.9 | 27.8 | 50.6 | 22.9 |
| 350 | 91.7 | 89.7 | 36.7 | 66.9 | 30.2 |
| 400 | 117.0 | 102.5 | 46.8 | 85.3 | 38.5 |
| 450 | 145.0 | 115.3 | 57.9 | 105.6 | 47.7 |
| 500 | 175.6 | 128.1 | 70.1 | 127.9 | 57.8 |
| 550 | 209.0 | 141.0 | 83.4 | 152.0 | 68.7 |
| 600 | 245.0 | 153.8 | 97.6 | 178.1 | 80.5 |
| 650 | 283.6 | 166.6 | 113.0 | 206.1 | 93.1 |
| 700 | 324.7 | 179.4 | 129.3 | 235.9 | 106.6 |
| 750 | 368.4 | 192.2 | 146.6 | 267.5 | 120.9 |
| 800 | 414.6 | 205.0 | 164.9 | 300.9 | 136.0 |

What is claimed is:

1. A transducer, comprising:
first and second piezoelectric elements, said piezoelectric elements bonded together in a bender bar configuration;
first and second end units each having an aperture, one end unit located at each end of said bonded piezoelectric elements;
first and second metallic plates bonded to said first and second piezoelectric elements, respectively, and to said first and second end units;
one or more electrodes located between said first and second piezoelectric elements, and
first and second mounting blocks, each of said mounting blocks being provided with a mounting aperture, wherein said first and second end unit apertures and said first and second mounting apertures may be aligned such that first and second mounting rods may be inserted through each of said first and second end unit apertures and said first and second mounting apertures and further wherein said first and second mounting apertures are of a geometry which provides two degrees of freedom for said first and second mounting rods.

2. The transducer of claim 1, wherein said first and second piezoelectric elements are bonded together by an adhesive bond.

3. An apparatus for pulsing a fluid in a tube, comprising:
an outer pulser sleeve;
means for diverting fluid flow from the tube through said pulser sleeve;
fluid pulsing means for pulsing fluid through said pulser sleeve, wherein said fluid pulsing means comprise a plurality of bender bar transducers; and means for mounting said fluid pulsing means around the inner periphery of said pulser sleeve.

4. The apparatus of claim 3, wherein said bender bar transducers comprise:

first and second piezoelectric elements, said piezoelectric elements bonded together;

first and second end units, one end unit located at each end of said bonded piezoelectric elements, each of said end units being provided with an aperture;

first and second metallic plates bonded to said first and second piezoelectric elements, respectively, and to said first and second end units; and one or more electrodes located in between said first and second piezoelectric elements.

5. The apparatus of claim 4, further comprising a filling fluid to fill the void region between the bender bar transducers and the pulser sleeve.

6. The apparatus of claim 5, wherein the filling fluid is oil.

7. The apparatus of claim 4, further comprising a central core located within the pulser sleeve for increasing the amplitude of the fluid pulses.

* * * * *